US012749874B2

(12) United States Patent
Di et al.

(10) Patent No.: US 12,749,874 B2
(45) Date of Patent: Sep. 29, 2026

(54) EXTERNAL-CAVITY-FREE LOW-THRESHOLD PEROVSKITE LASER DEVICE AND APPLICATION THEREOF

(71) Applicant: ZHEJIANG UNIVERSITY, Hangzhou (CN)

(72) Inventors: Dawei Di, Hangzhou (CN); Xuhui Cao, Hangzhou (CN); Shiyu Xing, Hangzhou (CN); Yaxiao Lian, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 615 days.

(21) Appl. No.: 18/344,987

(22) Filed: Jun. 30, 2023

(65) Prior Publication Data

US 2024/0006857 A1 Jan. 4, 2024

(30) Foreign Application Priority Data

Jul. 4, 2022 (CN) ........................ 202210786811.3

(51) Int. Cl.
*H01S 5/36* (2006.01)
*H01S 5/04* (2006.01)

(52) U.S. Cl.
CPC ................ *H01S 5/36* (2013.01); *H01S 5/041* (2013.01); *H01S 2304/04* (2013.01)

(58) Field of Classification Search
CPC ........................................................ H01S 5/36
See application file for complete search history.

(56) References Cited

U.S. PATENT DOCUMENTS 9,966,726 B2 * 5/2018 Xing ..................... H01S 3/1645
12,191,631 B2 * 1/2025 Lin ..................... H01S 5/18325
(Continued)

FOREIGN PATENT DOCUMENTS

CN 108376901 A * 8/2018 ........... H01S 3/0933
CN 111162446 A * 5/2020 ............... H01S 5/30
(Continued)

OTHER PUBLICATIONS

Zhu et al., Lead halide perovskite nanowire lasers with low lasing thresholds and high quality factors, Nature Materials, vol. 14, pp. 636-643 (Jun. 2015) (Year: 2015).*
(Continued)

*Primary Examiner* — James A Menefee

(57) ABSTRACT

Disclosed are an external-cavity-free low-threshold perovskite laser device and an application thereof. A gain medium is a perovskite material or a combination of the perovskite material and other materials. An ingredient of the perovskite is $A'_2A_{n-1}B_nX_{3n+1}$, or $ABX_3$, A' is an organic amine cation, A is a monovalent cation, B is a metal cation, and X is an anion; and a preparation method of the gain medium comprises dissolving A' X, AX and BX in a solvent to obtain a precursor solution of perovskite or a nanocrystalline, and the gain medium is prepared by a solution method. Or, the A' X, the AX and the BX are prepared by non-solution methods such as evaporation, vapor deposition, magnetron sputtering and solid-state reaction. According to the laser device in the invention, a resonant cavity does not need to be additionally designed and machined, so that compactness and integration of the device are improved.

8 Claims, 10 Drawing Sheets

(56) References Cited

U.S. PATENT DOCUMENTS

| | | | | |
|---|---|---|---|---|
| 2017/0012404 | A1* | 1/2017 | Xing | H01S 5/36 |
| 2019/0296521 | A1* | 9/2019 | Yun | H01S 5/36 |
| 2022/0320828 | A1* | 10/2022 | Leyden | G02B 6/13 |

FOREIGN PATENT DOCUMENTS

| | | | | | |
|---|---|---|---|---|---|
| CN | 111446619 | A | * | 7/2020 | H01S 5/36 |
| CN | 113683808 | A | * | 11/2021 | C09K 11/025 |
| CN | 113872037 | A | | 12/2021 | |
| CN | 114530753 | A | | 5/2022 | |
| CN | 114583553 | A | | 6/2022 | |
| WO | WO-2021039527 | A1 | * | 3/2021 | H05B 33/14 |

OTHER PUBLICATIONS

Yakunin et al., Low-threshold amplified spontaneous emission and lasing from colloidal nanocrystals of caesium lead halide perovskites, Nature Communications, (Aug. 2015) (Year: 2015).*
Jia et al., Continuous-wave lasing in an organic-inorganic lead halide perovskite semiconductor, Nature Photonics, vol. 11 (Dec. 2017) (Year: 2017).*

* cited by examiner

EXTERNAL-CAVITY-FREE LOW-THRESHOLD PEROVSKITE LASER DEVICE AND APPLICATION THEREOF

CROSS REFERENCE TO RELATED APPLICATIONS

This application claims foreign priority of Chinese Patent Application No. 202210786811.3, filed on Jul. 4, 2022 in the China National Intellectual Property Administration, the disclosures of all of which are hereby incorporated by reference.

TECHNICAL FIELD

The present invention relates to the field of optoelectronic materials and technologies, and particularly to an external-cavity-free low-threshold perovskite laser device and an application thereof.

BACKGROUND OF THE PRESENT INVENTION

Perovskite material is a novel semiconductor material with excellent optical properties, and has the advantages of large-area solution method preparation, a long carrier migration distance, a low defect state density, a narrow luminescence bandwidth, high photoluminescence quantum yield and a continuously adjustable optical band gap. In recent years, a photovoltaic device and a light-emitting device based on the perovskite material have developed rapidly, wherein power conversion efficiency of a perovskite solar cell has been improved from 4% to 25%, and external quantum efficiency of a perovskite light-emitting diode has been rapidly improved from 0.1% to more than 20% at present. Moreover, the high absorption coefficient, low defect density and high gain value of the perovskite material are comparable to classical semiconductor laser materials such as gallium arsenide. Moreover, the perovskite material shows a lower preparation cost, a simpler preparation method and a better mechanical flexibility of an organic material. The perovskite material shows a higher optical gain than an organic semiconductor gain medium material, thus being beneficial for realizing a high-performance semiconductor laser device. Most importantly, a band gap and an emission wavelength of the perovskite material may realize continuous broadband tuning from ultraviolet to near infrared by controlling a stoichiometric ratio of halogen in a solution or an ion exchange mode after synthesis. Therefore, the perovskite material may effectively make up for a "green gap" in a green optical band between a III nitride material and a V phosphide material used in a traditional inorganic semiconductor laser device. The perovskite material may be prepared by a low-cost solution method, which may solve the problem of high cost caused by traditional preparation methods such as metal-organic chemical vapor deposition (MOCVD) and molecular beam epitaxy (MBE) of the III-V materials, thus having great application prospects. At present, the laser device generally comprises three basic elements of a pumping source, a gain medium and a resonant cavity, wherein a resonant effect of the resonant cavity is essential in generation of laser. At present, in a perovskite laser device of optical pumping, the high-quality resonant cavity is mostly realized by complex process design and preparation. The resonant cavity is complicated in machining, long in working hour and high in cost, and a high-temperature preparation environment is involved and a rigid material is used during machining, so that it is difficult to combine with a flexible substrate tolerating a high temperature, thus further limiting an application of a flexible optoelectronic device. At present, researchers have found that lasing of random laser of the perovskite may be generated on the flexible laser substrate by the solution method, but formation of the random laser depends on scattering with a large loss, thus having the disadvantages of a high threshold and a high energy consumption. Therefore, it is urgent to realize a low-threshold perovskite laser device with simple preparation, a low threshold and a low loss, so as to realize an application thereof in many fields.

SUMMARY OF PRESENT INVENTION

The technical problem to be solved by the present invention is to provide an external-cavity-free low-threshold perovskite laser device and an application thereof aiming at the defects in the prior art. According to the present invention, the external-cavity-free low-threshold perovskite laser device is prepared on a rigid substrate and a flexible substrate by a preparation method with the characteristics of low-temperature preparation, and may be combined with the flexible substrate difficult to tolerate a high temperature, thus realizing an application of the laser device in the field of flexible optoelectronic devices.

An external-cavity-free low-threshold perovskite laser device consists of a gain medium composed of a perovskite material or a mixed material containing the perovskite material, and one or more of a substrate, an electrode and a charge transportation layer, wherein the gain medium is the perovskite material or the mixed material containing the perovskite material; the laser device does not need to contain an additionally designed and machined resonant cavity, a laser threshold of the laser device is lower than or equal to 100 μJ $cm^{-2}$ under femtosecond laser pumping, and the emitting threshold is lower than or equal to 1 mJ $cm^{-2}$ under picosecond or nanosecond laser pumping or the gain medium is excited by continuous laser pumping to realize laser emission; and an ingredient of the perovskite material is $A'_2A_{n-1}B_nX_{3n+1}$ or $ABX_3$, wherein n is a positive integer, A' is an organic amine cation, A is a monovalent cation, B is a metal cation, and X is an anion.

Preferably, a precursor solution of the perovskite material is prepared by dissolving A' X, AX and $BX_2$ in a solvent or dissolving the AX and the $BX_2$ in the solvent, and the solvent comprises, but is not limited to, one or a mixture of several of DMF, DMSO, GBL, NMP, DMA and ACN.

Preferably, a material form of the gain medium comprises, but is not limited to, a thin film, a microcrystalline, a fluorescent powder, a nanocrystalline, a quantum dot and a monocrystalline.

Preferably, the A' is the organic amine cation, which comprises, but is not limited to, one or a combination of several of a phenylethylamine cation $PEA^+$, a phenylbutylamine cation $PBA^+$, a 1,4-butanediamine cation $BDA2^+$, a p-fluorophenylethylamine cation p-F-$PEA^+$ and a 2-(4-methoxyphenyl)ethylamine cation $MOPEA^+$; the A is the monovalent cation, which comprises, but is not limited to, one or a combination of several of a cesium ion $Cs^+$, a methylamine ion $MA^+$, a formamidine ion $FA^+$, an ethylamine ion $EA^+$, a hydrazine ion $HA^+$, a guanidine ion $GA^+$, an isopropylamine ion $IPA^+$ and an imidazole ion $IA^+$; the B is the metal cation, which comprises, but is not limited to, one or a combination of several of a lead ion $Pb^{2+}$, a tin ion $Sn^{2+}$, a germanium ion $Ge^{2+}$, an indium ion $In^{2+}$ and a bismuth ion $Bi^{2+}$; and the X is the anion, which comprises, but is not limited to, one or a combination of several of a chloride ion $Cl^-$, a bromide ion $Br^-$, an iodide ion $I^-$, a carbonate ion $CO_3^{2-}$ and an oleate ion $OA^-$.

Preferably, an organic polymer, an organic small molecule, a metal, an oxide, a nitride, an inorganic salt, a dielectric material, an inorganic semiconductor material and a nanoparticle may be added into the gain medium, such as polymethyl methacrylate (PMMA), polyethylene glycol (PEG), polyethylene oxide (PEO), polyhydroxyethyl methacrylate (Poly-HEMA), 1,3,5-tris(1-phenyl-1H-benzimidazole-2-yl)benzene (TPBi), potassium bromide (KBr), potassium thiocyanate (KSCN), guanidine thiocyanate (GASCN), zinc oxide (ZnO), nickel oxide (NiO) and silicon dioxide ($SiO_2$).

Preferably, a type of a pumping source comprises an optical pumping source, an electric pumping source or a combination of the two pumping sources, and a pumping mode comprises pulse pumping and continuous pumping; for a working mode of optical pumping, a structure of the external-cavity-free perovskite laser device consists of the substrate and the gain medium containing the perovskite material; and for a working mode of electric pumping or a combined pumping source containing the electric pumping, the structure of the device consists of the gain medium containing the perovskite material and one or more of the substrate, the electrode and the charge transportation layer.

Preferably, the substrate comprises a rigid material substrate: quartz, glass, a silicon wafer, sapphire and a metal; a flexible material substrate: a polymer material, comprising polyethylene terephthalate PET, polyethylene naphthalene PEN, polyimide PI, polydimethylsiloxane PDMS, polyurethane acrylate and a Nolan optical adhesive NOA; a metal foil material: a titanium foil, a copper foil and a silver foil; and paper and flexible glass, a thin silicon wafer and a Moscow mica sheet; and a shape of the substrate is a flat surface or a curved surface.

Preferably, a preparation method of the gain medium comprises: dissolving A' X, AX and BX in a solvent or dissolving the AX and $BX_2$ in the solvent to obtain a precursor solution of perovskite or a nanocrystalline, and then preparing the gain medium by a solution method; or preparing the gain medium with the A' X, the AX and the BX or the AX and the $BX_2$ by methods of evaporation, MOCVD, ALD, ink-jet printing, vapor deposition, magnetron sputtering and solid-state reaction; or preparing the gain medium by one or a combination of several of the processes above.

Preferably, in an implementation method of the gain medium prepared by the solution method, a growth size of a grain of the perovskite is controlled by adjusting a proportion of a mixed solvent, and a proportion and a concentration of a precursor material, and adding an anti-solvent, so that a size of the grain changes in a range of several nanometers to hundreds of microns, thus controlling a laser emitting threshold and a gain of the gain medium.

An application of an external-cavity-free low-threshold perovskite laser device is disclosed, wherein the external-cavity-free low-threshold perovskite laser device is applicable to fields of display, lighting, communication, sensing, energy, biomedicine, optoelectronic integration and chips.

The present invention has the following beneficial effects.

(1) According to the external-cavity-free low-threshold perovskite laser device prepared, the resonant cavity does not need to be additionally designed and machined to emit laser, so that complexity of preparing the laser device can be greatly reduced, and compactness and integration of the device can be improved.

(2) The external-cavity-free low-threshold perovskite laser device prepared has a low threshold, and laser may be emitted under a condition of low pumping energy, thus having a small energy consumption ratio.

(3) The external-cavity-free low-threshold perovskite laser device prepared has good compatibility with the flexible substrate and anon-planar substrate, and may also be widely used in a flexible substrate device and a non-planar substrate device in addition to a common planar rigid substrate, and moreover, the flexible laser device prepared has high robustness, thus having potential advantages in the field of biosensing.

DETAILED DESCRIPTION OF PREFERRED EMBODIMENTS

Figure 1:
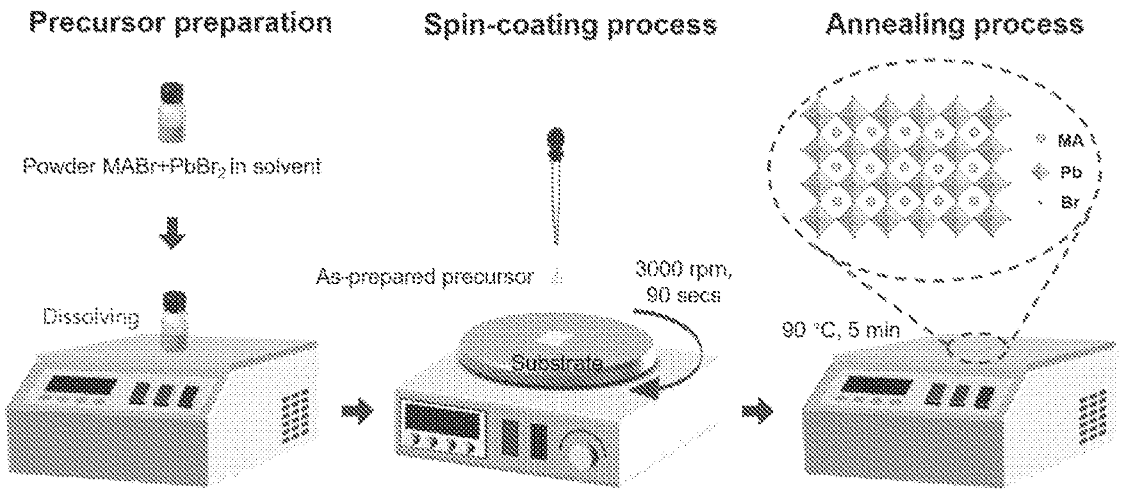
FIG. 1 is a flow chart of a preparation process of an external-cavity-free low-threshold perovskite laser device according to the present invention.

Method for preparing external-cavity-free low-threshold perovskite laser device:

(1) Rigid Substrate and Flexible Substrate

The substrate comprises a rigid material substrate, such as quartz or glass, a silicon wafer and sapphire, and various metals; a flexible material substrate, such as a polymer material, comprising polyethylene terephthalate (PET), polyethylene naphthalene (PEN), polyimide (PI), polydimethylsiloxane (PDMS), polyurethane acrylate and a Nolan optical adhesive (NOA); a metal foil, such as a titanium foil, a copper foil and a silver foil; and paper and flexible glass, a thin silicon wafer and a Moscow mica sheet. A gain medium layer is made of a perovskite material or a mixed material containing the perovskite material.

(2) Preparation of Perovskite Material or Precursor Solution Containing Perovskite Material An ingredient of the perovskite is $A'_2A_{n-1}B_nX_{3n+1}$ (n=1, 2, 3, . . . ) or $ABX_3$, wherein A' is an organic amine cation, such as a phenylethylamine cation ($PEA^+$), a phentermine cation ($PBA^+$), a 1,4-butanediamine cation ($BDA^{2+}$), a p-fluorophenylethylamine cation (p-F-$PEA^+$) and a 2-(4-methoxyphenyl)ethylamine cation ($MOPEA^+$); A is a monovalent cation, such as a cesium ion ($Cs^+$), a methylamine ion ($MA^+$), a formamidine ion ($FA^+$), an ethylamine ion ($EA^+$), a hydrazine ion ($HA^+$), a guanidine ion ($GA^+$), an isopropylamine ion ($IPA^+$) and an imidazole ion ($IA^+$). B is a metal cation, such as a lead ion ($Pb^{2-}$), a tin ion ($Sn^{2+}$), a germanium ion ($Ge^{2+}$), an indium ion ($In^{2+}$), a bismuth ion ($Bi^{2+}$), a silver ion ($Ag^+$) and a sodium ion ($Na^+$); and X is an anion, which comprises a chloride ion ($Cl^-$), a bromide ion ($Br^-$), an iodide ion ($I^-$), and the like. A' X, AX and BX are dissolved in a solvent to obtain a precursor solution of perovskite or a nanocrystalline, and the perovskite material and an optoelectronic device are prepared by a solution method. Solvents of the precursor solution of perovskite comprise organic polar solvents, such as dimethylformamide (DMF), G-butyrolactone (GBL), dimethyl sulfoxide (DMSO), N, N-dimethylacetamide (DMA), acetonitrile (ACN) and an ionic liquid, and a mixed solvent of the solvents above in different proportions. Other materials, such as polymers of polymethyl methacrylate (PMMA), polyethylene glycol (PEG), polyethylene oxide (PEO), polyhydroxyethyl methacrylate (Poly-HEMA), and the like, small molecules of 1,3,5-tris(1-phenyl-1H-benzimidazole-2-yl)benzene (TPBi), potassium bromide (KBr), potassium thiocyanate (KSCN), guanidine thiocyanate (GASCN), and the like, and oxides, may also be added into the precursor solution. In the process, some solvents such as chlorobenzene (CB), ethyl acetate (EA), chloroform (CF) and toluene may be optionally added as anti-solvents, or one or more materials such as the 1,3,5-tris(1-phenyl-1H-benzimidazole-2-yl)benzene (TPBi), the polyethylene glycol (PEG), the polyethylene oxide (PEO) and the polymethyl methacrylate (PMMA) may be dissolved to adjust a course of crystallization. A material form comprises, but is not limited to, a thin film, a microcrystalline, a fluorescent powder, a nanocrystalline, a quantum dot, a monocrystalline, and the like.

(3) Preparation of External-Cavity-Free Low-Threshold Perovskite Laser Device

The perovskite of the gain medium layer is prepared on the substrate by spin coating, spray coating, knife coating, roll-to-roll printing and other solution methods. Or, the external-cavity-free perovskite laser device is prepared with A' X, AX and BX or the AX and the BX by non-solution methods such as evaporation, vapor deposition, magnetron sputtering and solid-state reaction; or the external-cavity-free perovskite laser device is prepared by one or a combination of several of the processes above.

(4) Generation of External-Cavity-Free Low-Threshold Perovskite Laser

A pumping mode of the laser device may comprise optical pumping and electric pumping or combined pumping in different ways, and a type of a pumping source comprises a pulsed type and a continuous wave (CW) type. For the optical pumping, a structure of the device may consist of the substrate and the gain medium layer containing the perovskite material. For the electric pumping or the combined pumping containing the electric pumping, the structure of the device may consist of the gain medium containing the perovskite material and one or a combination of several of the substrate, an electrode and a charge transportation layer. The substrate comprises a rigid material substrate, such as quartz or glass, a silicon wafer and sapphire, and various metals; a flexible material substrate, such as a polymer material, comprising polyethylene terephthalate (PET), polyethylene naphthalene (PEN), polyimide (PI), polydimethylsiloxane (PDMS), polyurethane acrylate and a Nolan optical adhesive (NOA); a metal foil, such as a titanium foil, a copper foil and a silver foil; and paper and flexible glass, a thin silicon wafer and a Moscow mica sheet. A shape of the substrate may be a flat surface, a curved surface or other geometric configurations.

1. Embodiment 1 Preparation of External-Cavity-Free Low-Threshold Perovskite Laser Device In this embodiment, a quartz substrate was used, and a precursor solution of perovskite was dissolved in 1 mL of DMF/(DMF+DMSO) at a ratio of 0.2 according to a molar ratio of $MABr:PbBr_2=1.05:1$ to prepare 0.6 mol $L^{-1}$ solution, subjected to spin coating at 3,000 rpm for 90 seconds, and then annealed at 90° C. for 5 minutes after spin coating, so as to obtain the external-cavity-free low-threshold perovskite laser device.

FIG. 1 is a flow chart of a preparation process of the external-cavity-free low-threshold perovskite laser device. There are a substrate and a gain medium layer from bottom to top.

Figure 2:
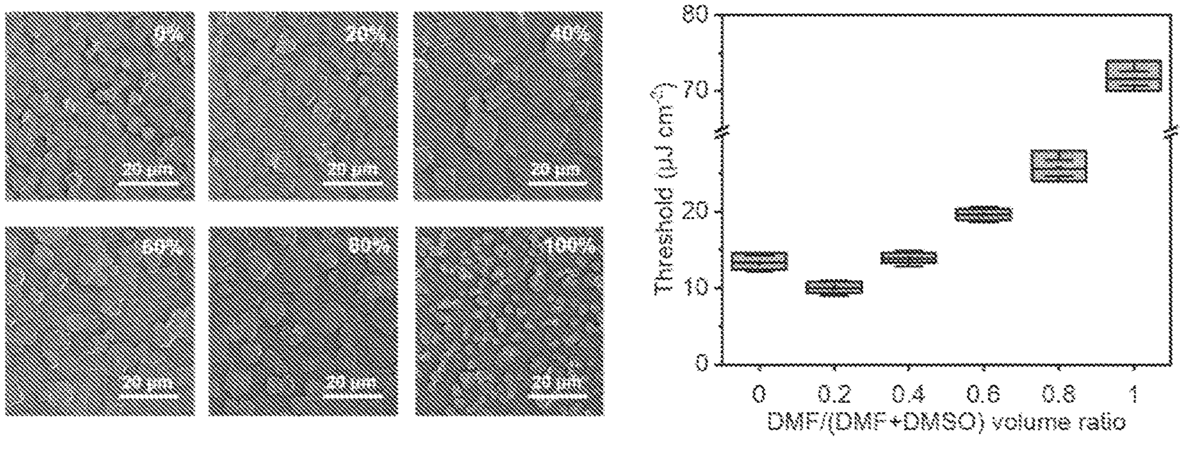
FIG. 2 shows an influence of a ratio of a DMSO solvent to a DMF solvent on a morphology and a laser threshold of the external-cavity-free low-threshold perovskite laser device according to the present invention.

FIG. 2 shows an influence of a ratio of a DMSO solvent to a DMF solvent on a morphology and a laser threshold of the external-cavity-free low-threshold perovskite laser device according to the present invention. It may be found that a laser threshold is the lowest when the ratio of the DMF/(DMF+DMSO) is 0.2.

Figure 3:
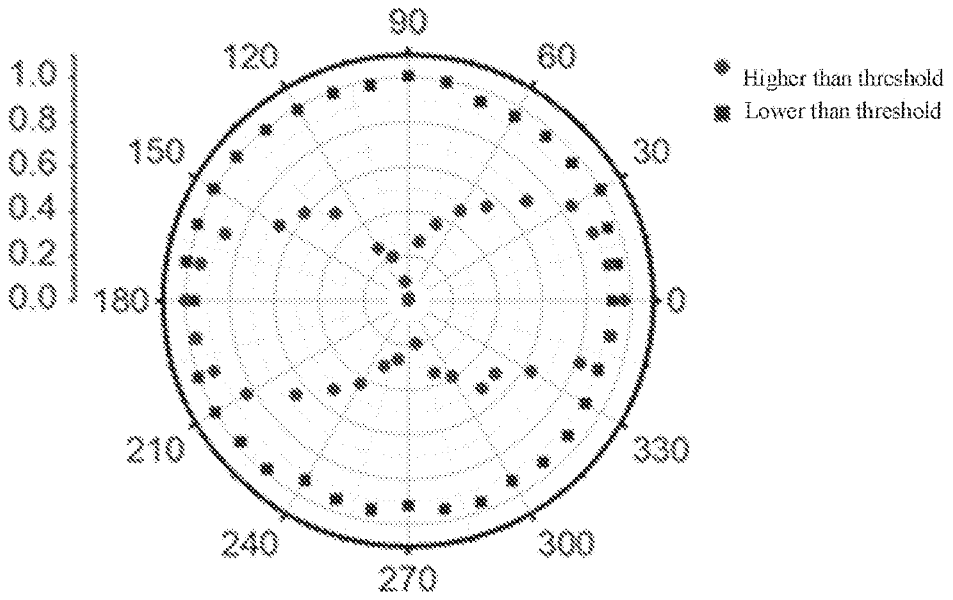
FIG. 3 is a polarization diagram of emitting light of the external-cavity-free low-threshold perovskite laser device in Embodiment 1 of the present invention.

FIG. 3 is a polarization diagram of emitting light of the external-cavity-free low-threshold perovskite laser device in Embodiment 1 of the present invention, wherein a test device is an optimal-threshold device with x=0.2. When the x is lower than a threshold, a degree of polarization of the emitting light is about 5%, and when the x is higher than the threshold, the degree of polarization of the emitting light is about 74%.

Figure 4:
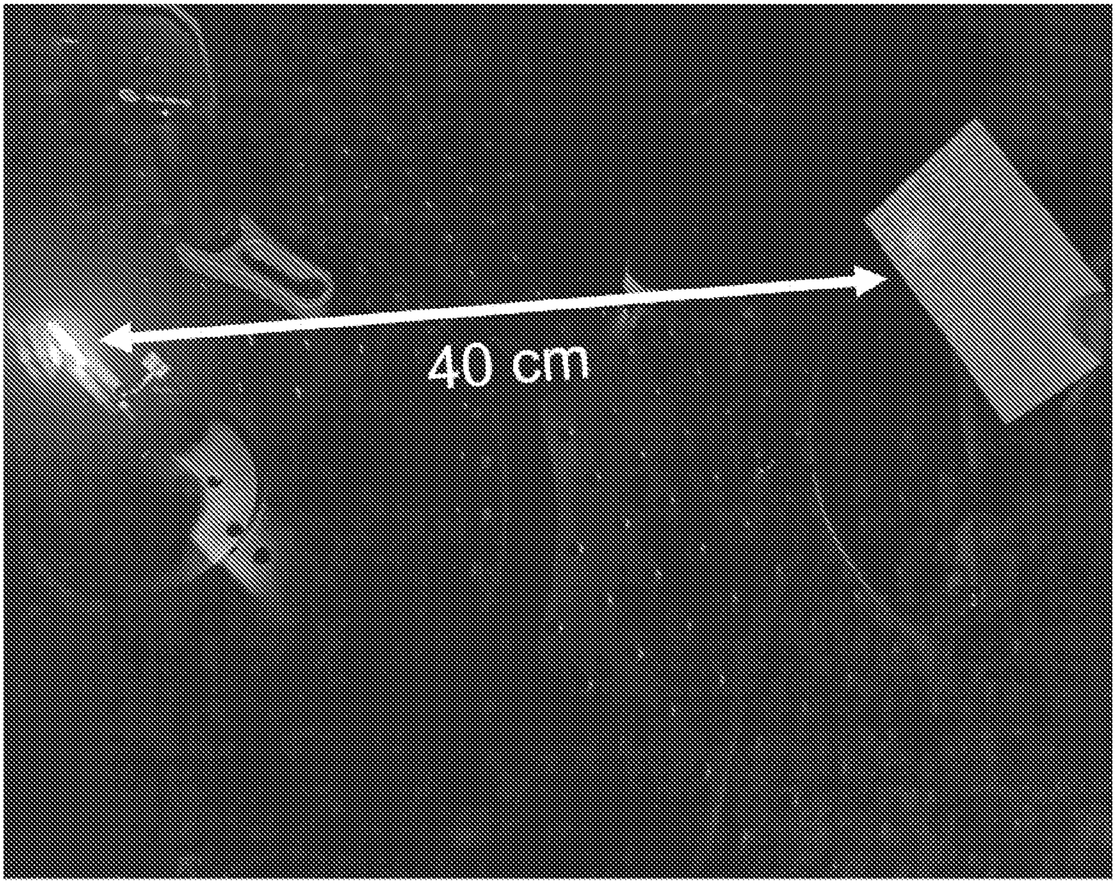
FIG. 4 is a profile diagram of a beam of the emitting light of the external-cavity-free low-threshold perovskite laser device in Embodiment 1 of the present invention.

FIG. 4 is a profile diagram of a beam of the emitting light of the external-cavity-free low-threshold perovskite laser device in Embodiment 1 of the present invention, wherein a test device is an optimal-threshold device with x=0.2. It is indicated that the emitting laser has good directivity.

Figure 5:
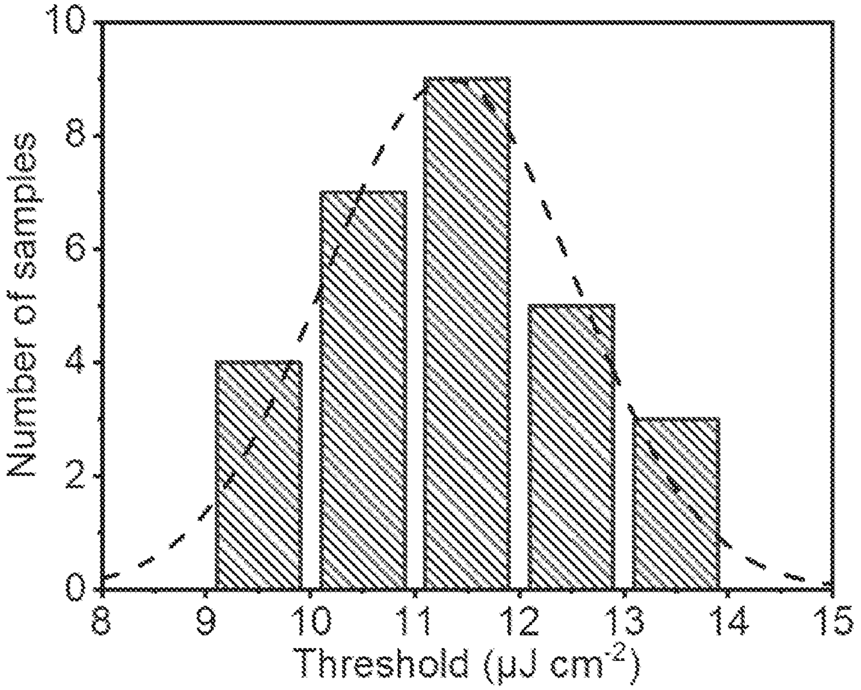
FIG. 5 is a distribution diagram of preparation repeatability of the external-cavity-free low-threshold perovskite laser device in Embodiment 1 of the present invention.

FIG. 5 is a distribution diagram of preparation repeatability of the external-cavity-free low-threshold perovskite laser device in Embodiment 1 of the present invention, wherein a test device is an optimal-threshold device with x=0.2. An average threshold of 11.7 $\mu J\ cm^{-2}$ is displayed by testing thresholds of 28 devices.

Figure 6:
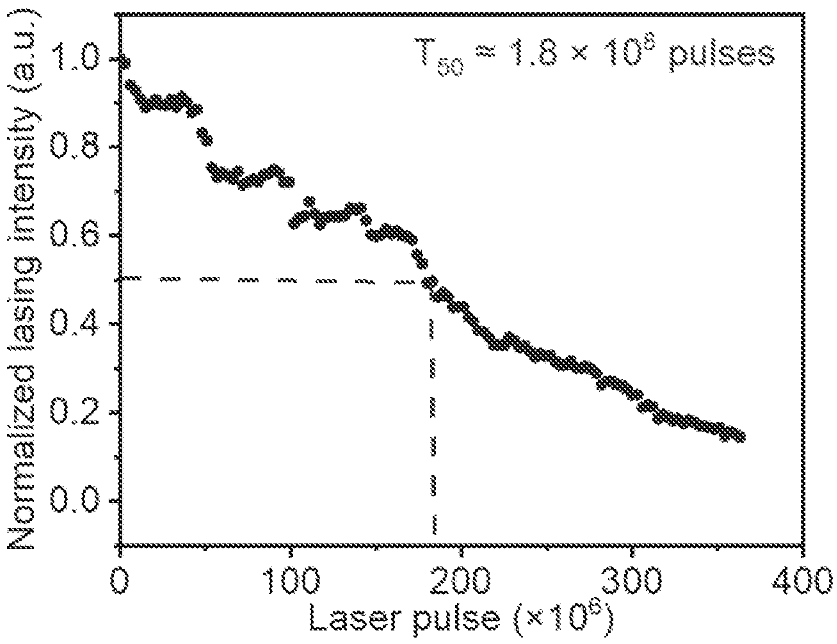
FIG. 6 is a stability test chart of the external-cavity-free low-threshold perovskite laser device in Embodiment 1 of the present invention.

FIG. 6 is a time stability test chart of the external-cavity-free low-threshold perovskite laser device in Embodiment 1 of the present invention, wherein a test device is an optimal-threshold device with x=0.2. Under room-temperature continuous fs optical pumping in air (at a power density of 20 $\mu J\ cm^{-2}$), about $1.8\times10^8$ laser pulses are gone through when a lasing intensity decays from the highest to the half.

2. Embodiment 2 Preparation of Perovskite Device that Only Generates Amplified Spontaneous Emission (ASE)

A quartz substrate was used, and a precursor solution of perovskite was dissolved in 1 mL of DMSO according to a molar ratio of $MABr:PbBr_2=1.05:1$ to prepare 0.6 mol $L^{-1}$ solution, and subjected to spin coating at 3,000 rpm for 90 seconds. About 50 seconds after starting the spin coating process, 200 μL of chlorobenzene was dropwise added onto the sample, and the sample was annealed at 90° C. for 5 minutes after spin coating, so as to obtain the perovskite device that had the same material ingredient and could only generate amplified spontaneous emission (ASE).

Figure 7:
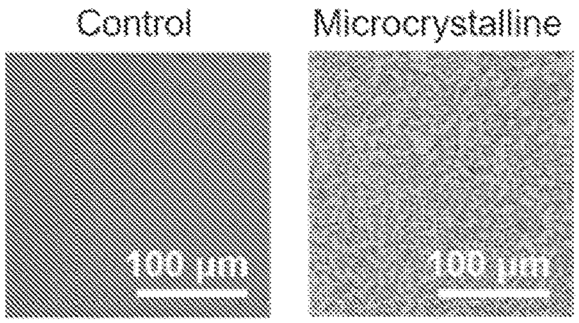
FIG. 7 is an optical microscope image of the external-cavity-free low-threshold perovskite laser device in Embodiment 1 of the present invention and a perovskite device made of the same material that only generates amplified spontaneous emission (ASE) in Embodiment 2.
Figure 8:
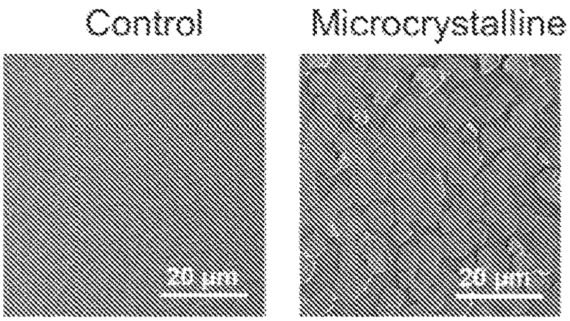
FIG. 8 is a SEM (scanning electron microscope) image of the external-cavity-free low-threshold perovskite laser device in Embodiment 1 of the present invention and the perovskite device made of the same material that only generates amplified spontaneous emission (ASE) in Embodiment 2.
Figure 9:
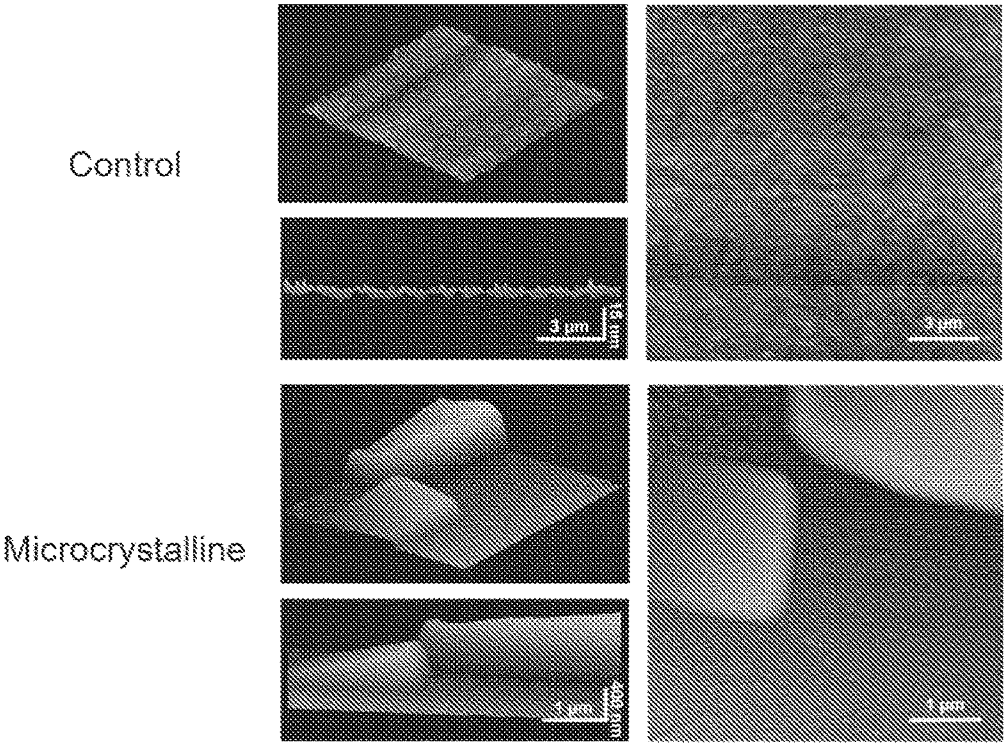
FIG. 9 is an AFM (atomic force microscope) image of the external-cavity-free low-threshold perovskite laser device in Embodiment 1 of the present invention and the perovskite device made of the same material that only generates amplified spontaneous emission (ASE) in Embodiment 2.

FIG. 7, FIG. 8 and FIG. 9 are a scanning electron microscope (SEM) image and an atomic force microscope (AFM) image of the external-cavity-free low-threshold perovskite laser device with x=0.2 in Embodiment 1 of the present invention and the perovskite device that has the same material ingredient and only generates amplified spontaneous emission (ASE) in Embodiment 2. It can be seen that a thin film of the external-cavity-free low-threshold perovskite laser device is relatively rough, while a thin film of the ASE perovskite laser device is relatively smooth. A microcrystalline may be seen on the thin film of the external-cavity-free low-threshold perovskite laser device, which is named the laser device in the present invention; while the thin film of the ASE perovskite laser device is relatively smooth, with a nanocrystalline, which is named the ASE device in the present invention.

Figure 10:
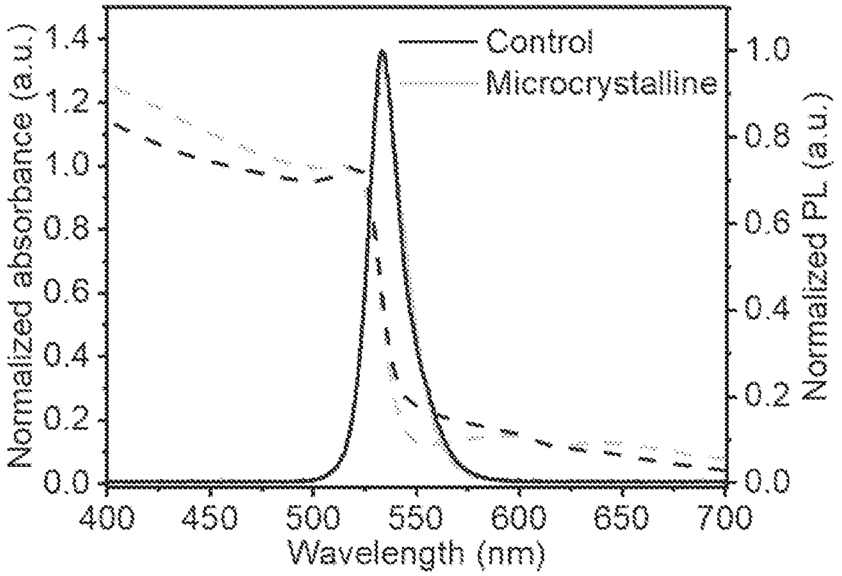
FIG. 10 is an absorbance and photoluminescence spectra of the external-cavity-free low-threshold perovskite laser device in Embodiment 1 of the present invention and the perovskite device made of the same material that only generates amplified spontaneous emission (ASE) in Embodiment 2.

FIG. 10 is an absorbance and fluorescence diagram of the external-cavity-free low-threshold perovskite laser device with x=0.2 in Embodiment 1 of the present invention and the perovskite device that has the same material ingredient and only generates amplified spontaneous emission (ASE) in Embodiment 2. It can be seen from the figure that an absorption band edge and a fluorescence peak are basically consistent, which further proves that band gaps of the two samples are basically the same.

Figure 11:
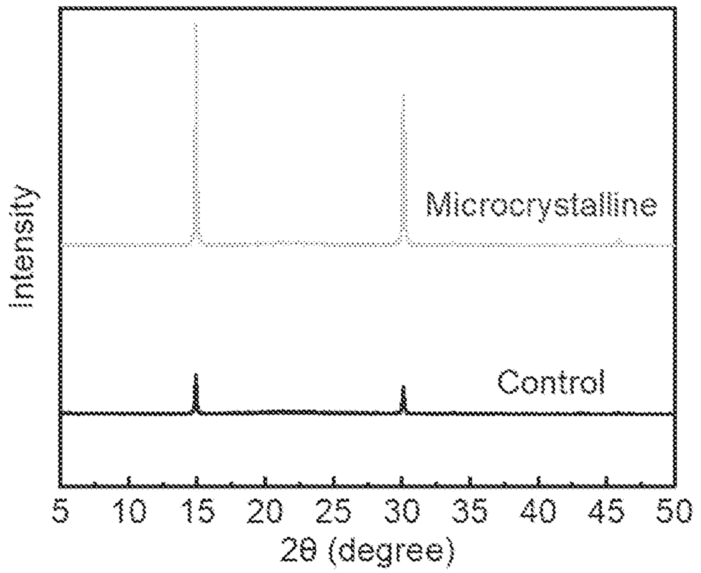
FIG. 11 is an XRD (X-ray diffraction intensity-angle) spectra of the external-cavity-free low-threshold perovskite laser device in Embodiment 1 of the present invention and the perovskite device made of the same material that only generates amplified spontaneous emission (ASE) in Embodiment 2.

FIG. 11 is an XRD (X-ray diffraction intensity-angle) diagram of the external-cavity-free low-threshold perovskite laser device with x=0.2 in Embodiment 1 of the present invention and the perovskite device that has the same material ingredient and only generates amplified spontaneous emission (ASE) in Embodiment 2. It can be seen from the figure that the laser thin film has better crystallinity.

Figure 12:
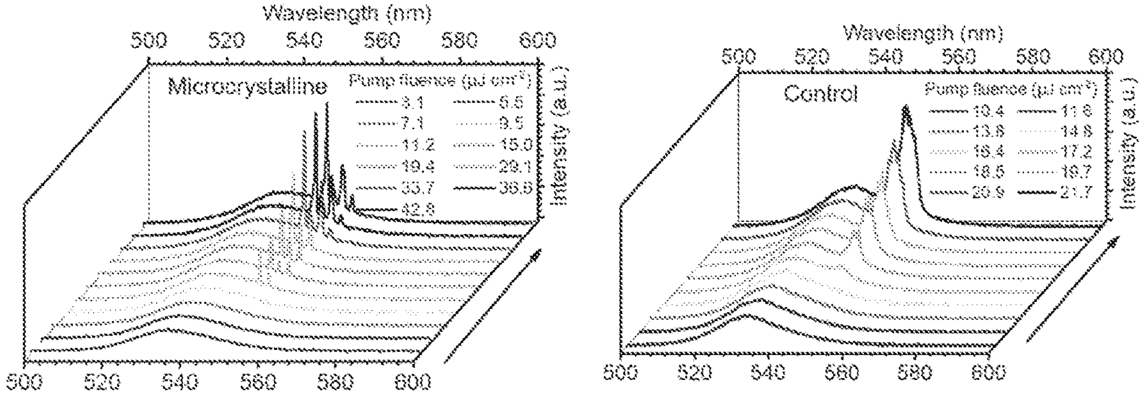
FIG. 12 is a variable excitation power spectrogram of the external-cavity-free low-threshold perovskite laser device in Embodiment 1 of the present invention and a perovskite device made of the same material that only generates amplified spontaneous emission (ASE) in Embodiment 2.
Figure 13:
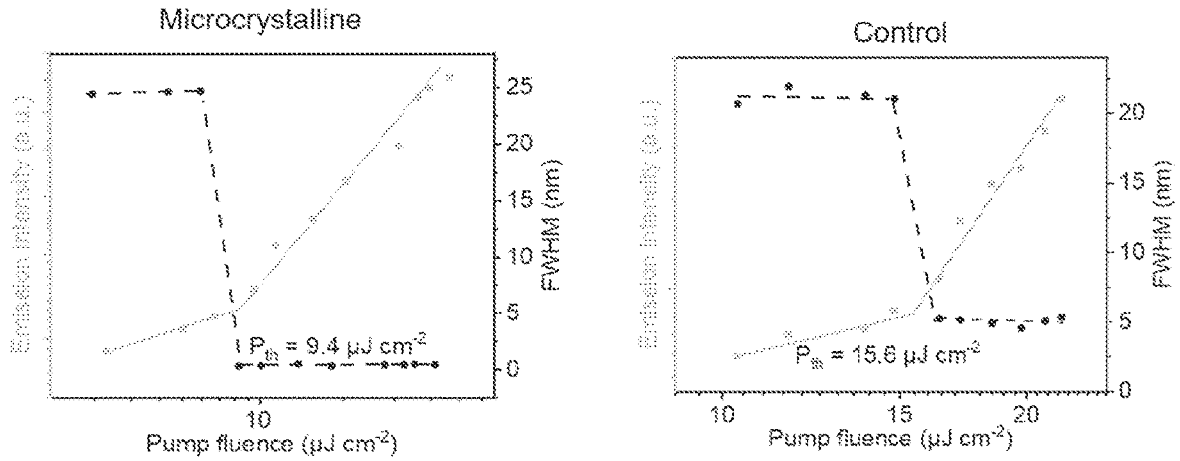
FIG. 13 is an emission intensity and FWHM (full width at half maximum)—excitation power diagram of the external-cavity-free low-threshold perovskite laser device in Embodiment 1 of the present invention and a perovskite device made of the same material that only generates amplified spontaneous emission (ASE) in Embodiment 2.

FIG. 12 and FIG. 13 are a variable excitation power spectrogram and a spectral intensity and FWHM (full width at half maximum)—excitation power diagram of the external-cavity-free low-threshold perovskite laser device with x=0.2 in Embodiment 1 of the present invention and the perovskite device that has the same material ingredient and only generates amplified spontaneous emission (ASE) in Embodiment 2. The device in Embodiment 1 displays emission of laser with a threshold of 9.4 $\mu J\ cm^{-2}$, which has a narrow linewidth (~0.3 nm), while the device in Embodiment 2 only generates ASE with a higher threshold (15.6 $\mu J\ cm^{-2}$), which has a wide linewidth (~5 nm).

Figure 14:
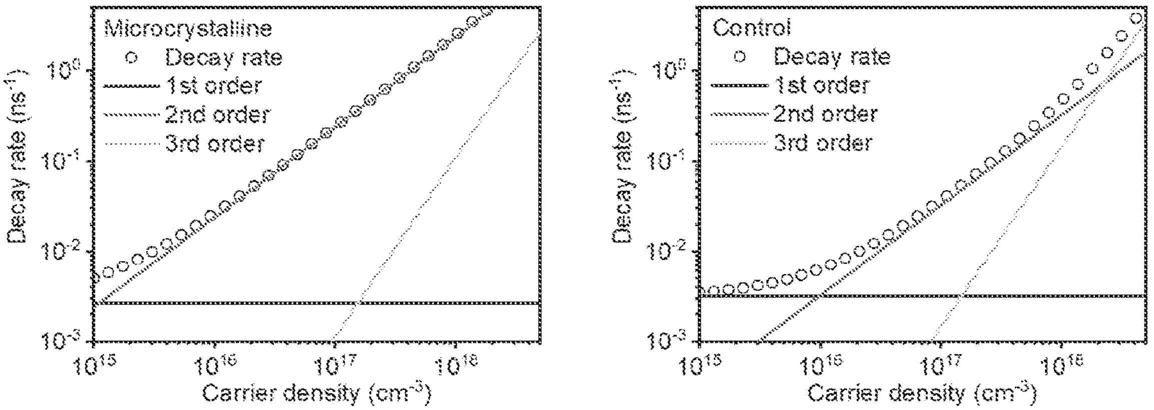
FIG. 14 shows fitting results of 1$^{st}$ orders ($k_1$), 2$^{nd}$ orders ($k_2$) and 3$^{rd}$ orders (k) of femtosecond transient absorption (TA) spectra of the external-cavity-free low-threshold perovskite laser device in Embodiment 1 of the present invention and the perovskite device made of the same material that only generates amplified spontaneous emission (ASE) in Embodiment 2.

FIG. 14 shows fitting results of $1^{st}$ orders ($k_1$), $2^{d}$d orders ($k_2$) and $3^{rd}$ orders ($k_3$) of femtosecond transient absorption (TA) spectra of the external-cavity-free low-threshold perovskite laser device with x=0.2 in Embodiment 1 of the present invention and the perovskite device that has the same material ingredient and only generates amplified spontaneous emission (ASE) in Embodiment 2, wherein $k_1$ represents a defect-assisted recombination coefficient, $k_2$ represents an inter-band radiation recombination coefficient, and $k_3$ represents an auger recombination coefficient. It can be seen from the figure that $k_1$ and $k_3$ of the laser device and the ASE device are basically the same in magnitude, $k_2$ of the laser device is one order of magnitude higher that of the ASE device. The inter-band radiation recombination coefficient $k_2$ of the laser device is high, so that the laser device has a higher radiation recombination rate than that of the ASE device, which is an important reason for generation of low-threshold laser.

Figure 15:
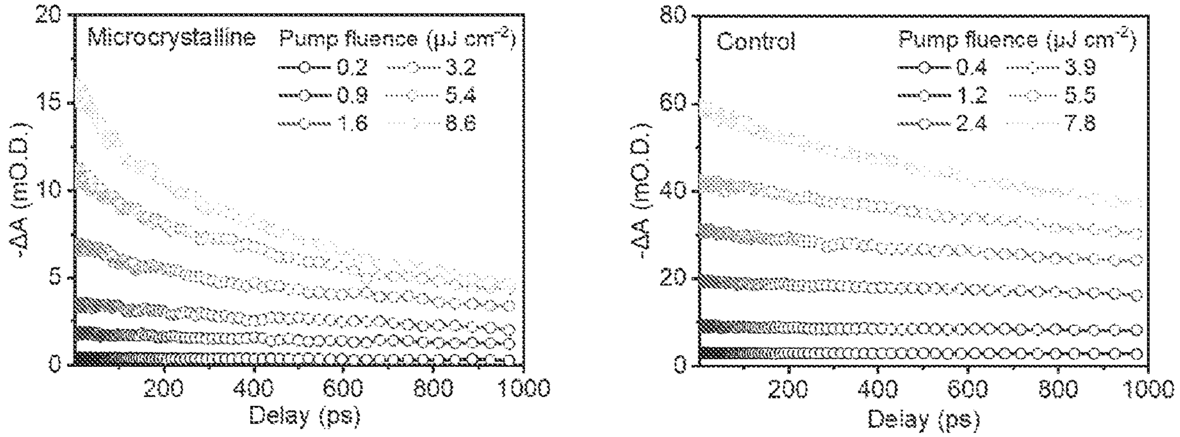
FIG. 15 is a kinetic of TA spectra under different power of the external-cavity-free low-threshold perovskite laser device in Embodiment 1 of the present invention and a perovskite device made of the same material that only generates amplified spontaneous emission (ASE) in Embodiment 2.

FIG. 15 is a TA test chart under different power of the external-cavity-free low-threshold perovskite laser device with x=0.2 in Embodiment 1 of the present invention and the perovskite device that has the same material ingredient and only generates amplified spontaneous emission (ASE) in Embodiment 2. It can be seen from the figure that the laser device has a faster falling edge, which may be a Purcell enhancement effect in a laser formation process.

Figure 16:
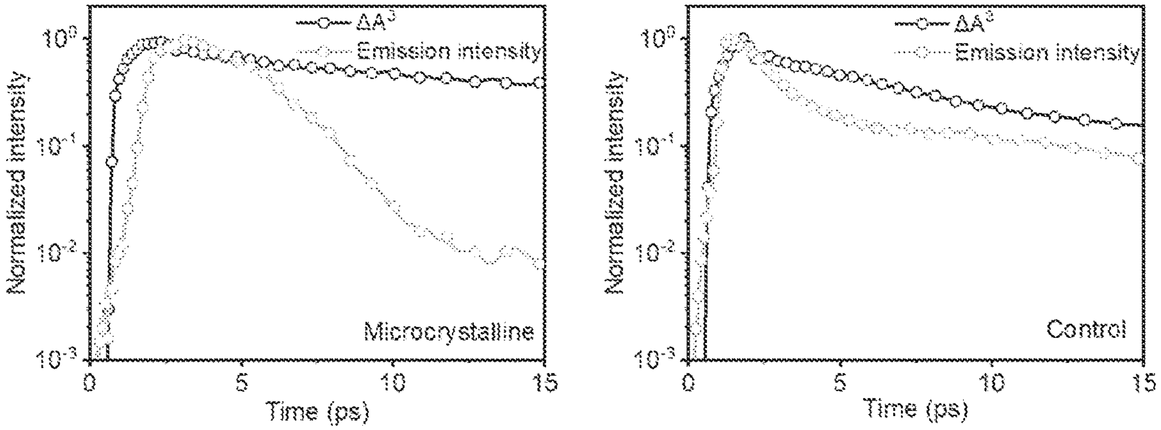
FIG. 16 is a transient photoluminescence (TRPL) kinetics of the external-cavity-free low-threshold perovskite laser device in Embodiment 1 of the present invention and the perovskite device made of the same material that only generates amplified spontaneous emission (ASE) in Embodiment 2.

FIG. 16 is a transient fluorescence (TRPL) test chart of the external-cavity-free low-threshold perovskite laser device with x=0.2 in Embodiment 1 of the present invention and the perovskite device that has the same material ingredient and only generates amplified spontaneous emission (ASE) in Embodiment 2. It can be seen from the transient fluorescence diagram that the laser device has longer rising edge time (rising time of the laser device is 1.4 ps, and rising time of the ASE device is 0.3 ps), the longer rising edge time may be due to an additional resonance process in a laser generation process compared with an ASE generation process, and the resonance process requires a certain period of time. Meanwhile, by comparing third powers of carriers in TRPL and TA, it can be seen that a laser emission process and an ASE emission process both have a higher-order element, and this process in laser is about several picoseconds long (2.8 ps for the laser device and 1.7 ps for the ASE device).

3. Embodiment 3 Preparation of External-Cavity-Free Low-Threshold Perovskite Flexible Laser Device A PET substrate was used, and a precursor solution of perovskite was dissolved in 1 mL of DMF/(DMF+DMSO) at a ratio of 0.2 according to a molar ratio of $MABr:PbBr_2$=1.05:1 to prepare 0.6 mol LV solution, subjected to spin coating at 3,000 rpm for 90 seconds, and then annealed at 90° C. for 5 minutes after spin coating, so as to obtain the external-cavity-free low-threshold perovskite laser device.

Figure 17:
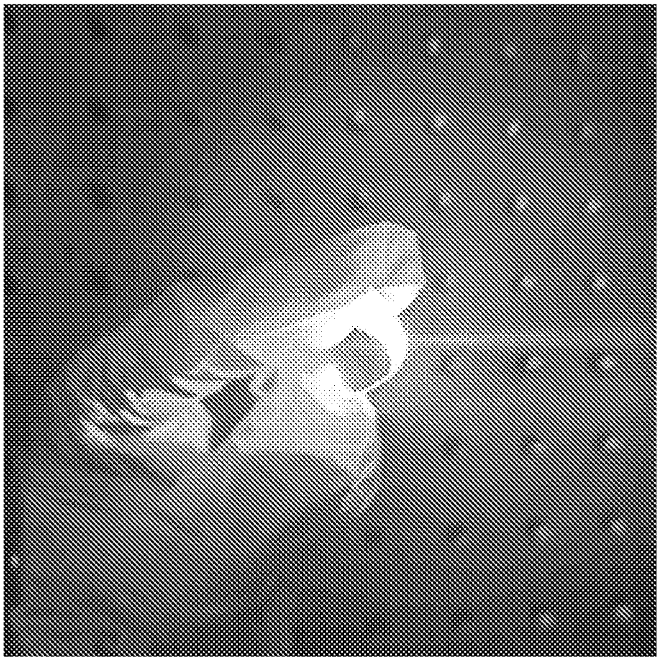
FIG. 17 is an entity display image of an external-cavity-free low-threshold perovskite flexible laser device in Embodiment 3 of the present invention.

FIG. 17 is an entity display image of an external-cavity-free low-threshold perovskite flexible laser device in Embodiment 3 of the present invention.

Figure 18:
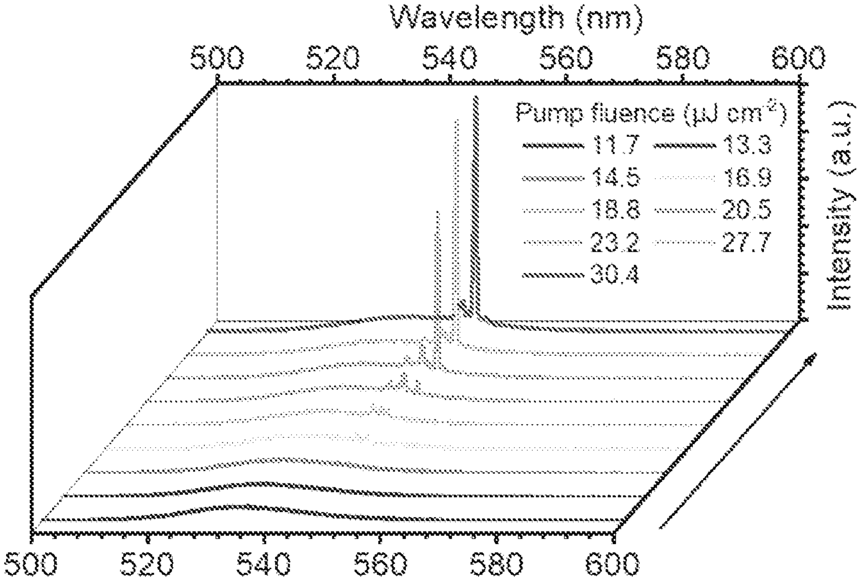
FIG. 18 is a variable excitation power spectrogram of the external-cavity-free low-threshold perovskite flexible laser device in Embodiment 3 of the present invention.
Figure 19:
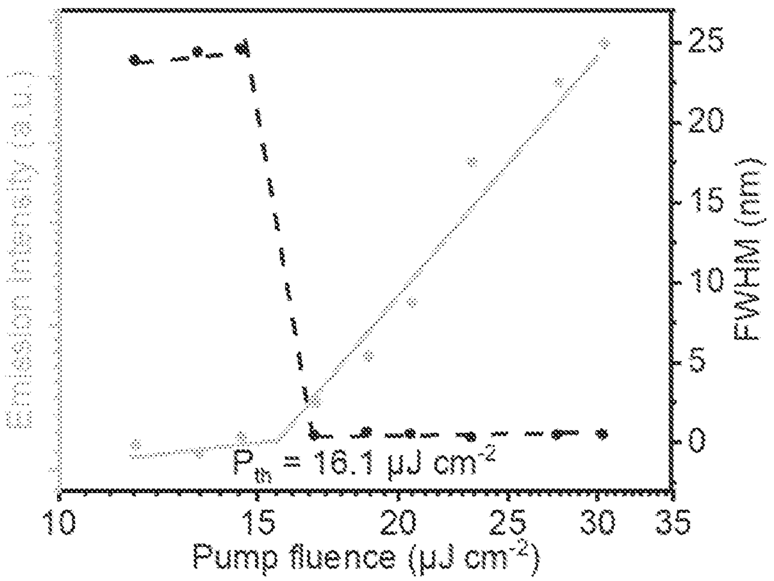
FIG. 19 is a spectral intensity and FWHM (full width at half maximum)—excitation power diagram of the external-cavity-free low-threshold perovskite flexible laser device in Embodiment 3 of the present invention.

FIG. 18 and FIG. 19 are a variable excitation power spectrogram and a spectral intensity and FWHM (full width at half maximum)—excitation power diagram of the external-cavity-free low-threshold perovskite flexible laser device in Embodiment 3 of the present invention. The laser device displays emission of laser with a threshold of 16.1 $\mu J/cm^2$.

Figure 20:
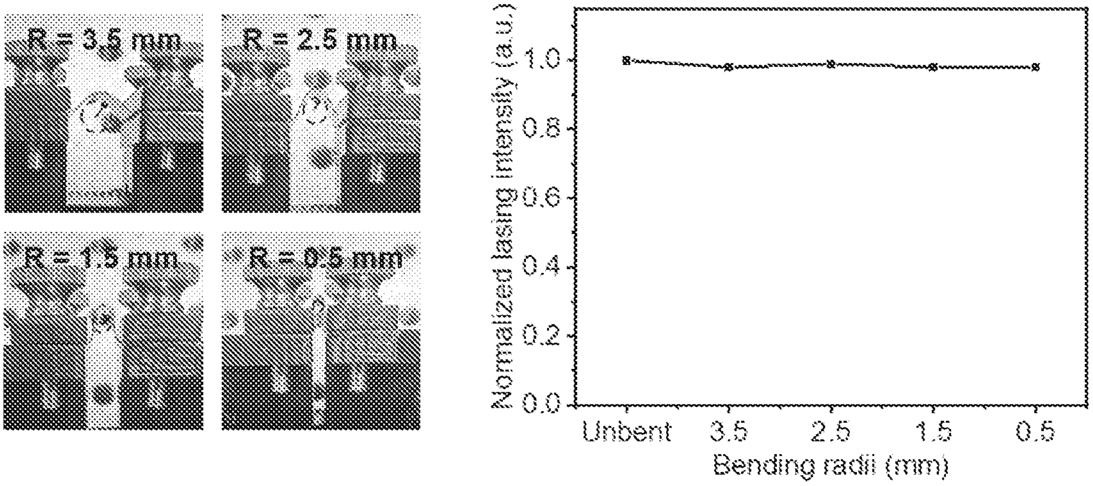
FIG. 20 is a stability test chart of a bending curvature of the external-cavity-free low-threshold perovskite flexible laser device in Embodiment 3 of the present invention.
Figure 21:
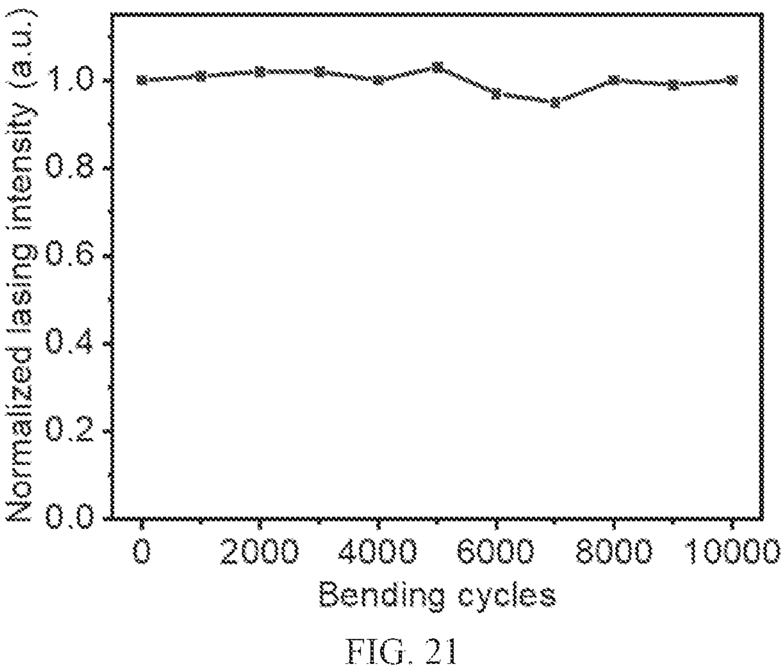
FIG. 21 is a stability test chart of bending cycles of the external-cavity-free low-threshold perovskite flexible laser device in Embodiment 3 of the present invention.

FIG. 20 and FIG. 21 are a stability test chart of a bending curvature and a stability test chart of bending cycles of the external-cavity-free low-threshold perovskite flexible laser device in Embodiment 3 of the present invention. The laser device displays that there is still excellent bending stability with initial laser energy above 95% under different curvature radii (3.5 mm, 2.5 mm, 1.5 mm and 0.5 mm) after 10,000 bending cycles.

4. Embodiment 4 Preparation of External-Cavity-Free Low-Threshold Perovskite Laser Device A glass sheet was used as a substrate, and a precursor solution of perovskite was dissolved in 1 mL of DMSO according to a molar ratio of $FABr:PbBr_2$=1:1 to prepare 0.6 mol $L^{-1}$ solution. The precursor solution was added with 5 mg of polyethylene oxide (PEO), subjected to spin coating at 3,000 rpm for 90 seconds, and then annealed at 90° C. for 5 minutes after spin coating, so as to obtain the external-cavity-free low-threshold perovskite laser device. Under femtosecond laser pumping, laser could be emitted, and a wavelength of the emitted laser was about 550 nm.

5. Embodiment 5 Preparation of External-Cavity-Free Low-Threshold Perovskite Flexible Laser Device Polyethylene naphthalene (PEN) was used as a substrate, and a precursor solution of perovskite was dissolved in 1 mL of DMSO according to a molar ratio of $MACl:MABr:PbBr_2$=1:4:5 to prepare 0.6 mol $L^{-1}$ solution, subjected to spin coating at 3,000 rpm for 90 seconds, and then annealed at 90° C. for 5 minutes after spin coating, so as to obtain the external-cavity-free low-threshold perovskite laser device. Under femtosecond laser pumping, laser could be emitted, and a wavelength of emission was about 510 nm.

6. Embodiment 6 Preparation of External-Cavity-Free Low-Threshold Perovskite Flexible Laser Device A large are of polyimide (PI) was used as a substrate, and a precursor solution of perovskite was dissolved in 1 mL of DMSO according to a molar ratio of $MABr:PbBr_2$=1:1 to prepare 0.6 mol LV solution. The external-cavity-free perovskite laser device was prepared with the precursor solution by knife coating.

The above are only the preferred specific embodiments of the present invention, but the scope of protection of the present invention is not limited to this. Equivalent substitutions or changes made by those skilled in the art according to the technical solutions and the inventive concept of the present invention within the technical scope described by the present invention all belong to the scope of protection of the present invention.

We claim:

1. An external-cavity-free low-threshold perovskite laser device, comprising:

a gain medium, composed of a perovskite material or a mixed material containing the perovskite material; and at least one selected from the group consisting of a substrate, an electrode, and a charge transportation layer;

wherein the laser device has no resonant cavity and is free of an additionally designed and machined resonant cavity;

wherein the gain medium has a rough surface morphology comprising microcrystalline grains having a size ranging from several nanometers to hundreds of microns, and laser emission is generated by reflection and scattering of light among said microcrystalline grains without relying on end facets of the gain medium as a Fabry-perot cavity;

wherein a laser emitting threshold of the laser device is lower than or equal to 100 $\mu J\ cm^{-2}$ under femtosecond laser pumping, and lower than or equal to 1 $mJ\ cm^{-2}$ under picosecond or nanosecond laser pumping, or the gain medium is excited by continuous laser pumping to realize laser emission; and wherein an ingredient of the perovskite material is $A'_2A_{n-1}B_nX_{3n+1}$, or $ABX_3$, wherein n is a positive integer, A' is an organic amine cation, A is a monovalent cation, B is a metal cation, and X is an anion.

2. The external-cavity-free low-threshold perovskite laser device according to claim 1, wherein the gain medium is in a material form selected from a thin film, a crystallite, a fluorescent powder, a nanocrystalline, a quantum dot, and a single crystal.

3. The external-cavity-free low-threshold perovskite laser device according to claim 1, wherein the A' is the organic amine cation selected from one or more of a phenylethylamine cation $PEA^+$, a phentermine cation $PBA^+$, a 1,4-butanediamine cation $BDA2^+$, a p-fluorophenylethylamine cation $p\text{-}F\text{-}PEA^+$, and a 2-(4-methoxyphenyl)ethylamine cation $MOPEA^+$;

wherein the A is the monovalent cation selected from one or more of a cesium ion $Cs^+$, a methylamine ion $MA^+$, a formamidine ion $FA^+$, an ethylamine ion $EA^+$, a hydrazine ion $HA^+$, a guanidine ion $GA^+$, an isopropylamine ion $IPA^+$, and an imidazole ion $IA^+$;

wherein the B is the metal cation selected from one or more of a lead ion $Pb^{2+}$, a tin ion $Sn^{2+}$, a germanium ion $Ge^{2+}$, an indium ion $In^{2+}$ and a bismuth ion $Bi^{2+}$; and wherein the X is the anion selected from one or more of a chloride ion $Cl^-$, a bromide ion $Br^-$, an iodide ion $I^-$, a carbonate ion $CO_3^{2-}$, and an oleate ion OA.

4. The external-cavity-free low-threshold perovskite laser device according to claim 1, wherein one of an organic polymer, an organic small molecule, a metal, an oxide, a nitride, an inorganic salt, a dielectric material, an inorganic semiconductor material, and a nanoparticle is added into the gain medium.

5. The external-cavity-free low-threshold perovskite laser device according to claim 1, wherein a type of a pumping source comprises an optical pumping source, an electric pumping source or a combination of the two pumping sources, and a pumping mode comprises pulse pumping and continuous pumping; for a working mode of optical pumping, a structure of the external-cavity-free perovskite laser device consists of the substrate and the gain medium containing the perovskite material; and for a working mode of electric pumping or a combined pumping source containing the electric pumping, the structure of the device consists of the gain medium containing the perovskite material and one or more selected from the substrate, the electrode and the charge transportation layer.

6. The external-cavity-free low-threshold perovskite laser device according to claim 5, wherein the substrate is a rigid material substrate or a flexible material substrate;

wherein the rigid material substrate is selected from one or more of quartz, glass, a silicon wafer, sapphire and a metal;

wherein the flexible material substrate is selected from one or more of a polymer material, a metal foil material, paper, flexible glass, a thin silicon wafer, and a Moscow mica sheet; wherein the polymer material is selected from one or more of polyethylene terephthalate PET, polyethylene naphthalene PEN, polyimide PI, polydimethylsiloxane PDMS, polyurethane acrylate, and a Nolan optical adhesive NOA; wherein the metal foil material is selected from one or more of a titanium foil, a copper foil and a silver foil;

wherein the substrate has a flat surface or a curved surface.

7. The external-cavity-free low-threshold perovskite laser device according to claim 1, wherein the substrate is a rigid material substrate or a flexible material substrate;

wherein the rigid material substrate is selected from one or more of quartz, glass, a silicon wafer, sapphire and a metal;

wherein the flexible material substrate is selected from one or more of a polymer material, a metal foil material, paper, flexible glass, a thin silicon wafer, and a Moscow mica sheet; wherein the polymer material is selected from one or more of polyethylene terephthalate PET, polyethylene naphthalene PEN, polyimide PI, polydimethylsiloxane PDMS, polyurethane acrylate, and a Nolan optical adhesive NOA; wherein the metal foil material is selected from one or more of a titanium foil, a copper foil and a silver foil;

wherein the substrate has a flat surface or a curved surface.

8. A method of using an external-cavity-free low-threshold perovskite laser device, comprising:

providing the external-cavity-free low-threshold perovskite laser device as recited in claim 1; and applying the external-cavity-free low-threshold perovskite laser device one or more fields selected from the group consisting of display, lighting, communication, sensing, energy, biomedicine, optoelectronic integration, and chips.

* * * * *